United States Patent
Otoguro et al.

(10) Patent No.: US 11,312,233 B2
(45) Date of Patent: Apr. 26, 2022

(54) SHIFT BRACKET

(71) Applicant: Toyota Jidosha Kabushiki Kaisha, Toyota (JP)

(72) Inventors: Kazuma Otoguro, Toyota (JP); Satoshi Kasai, Nagoya (JP); Naruaki Tsutsumi, Nisshin (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/535,511

(22) Filed: Aug. 8, 2019

(65) Prior Publication Data
US 2020/0062113 A1 Feb. 27, 2020

(30) Foreign Application Priority Data
Aug. 21, 2018 (JP) .............................. JP2018-154733

(51) Int. Cl.
*B60K 20/04* (2006.01)
*F16H 59/02* (2006.01)
*B62D 25/20* (2006.01)

(52) U.S. Cl.
CPC .......... *B60K 20/04* (2013.01); *B62D 25/2009* (2013.01); *F16H 59/02* (2013.01); *F16H 2059/026* (2013.01)

(58) Field of Classification Search
CPC ........... H02G 3/10; H02G 3/105; H05K 5/00; H05K 5/04; B60K 20/04; B62D 25/2009; F16H 59/02; F16H 2059/026; B60R 16/0238; B60R 16/0239; B60R 16/027; B60R 16/037

USPC ........ 74/473.15, 473.3, 473.31, 473.36, 493, 74/525
See application file for complete search history.

(56) References Cited

U.S. PATENT DOCUMENTS

| | | | | |
|---|---|---|---|---|
| 4,912,997 A * | 4/1990 | Malcolm | ............... | F16H 59/044 338/128 |
| 5,462,146 A | 10/1995 | Doolittle et al. | | |
| 6,076,877 A * | 6/2000 | Krieg | ...................... | B60R 11/02 296/204 |
| 6,241,209 B1 * | 6/2001 | von Mayenburg | .... | B60N 2/501 248/421 |
| 7,291,023 B1 * | 11/2007 | Still | ........................ | B60R 21/01 439/65 |

(Continued)

FOREIGN PATENT DOCUMENTS

| | | | |
|---|---|---|---|
| JP | 6-80038 A | 3/1994 | |
| JP | 11314532 A | 11/1999 | |

(Continued)

*Primary Examiner* — Jake Cook
*Assistant Examiner* — T. Scott Fix
(74) *Attorney, Agent, or Firm* — Dinsmore & Shohl LLP

(57) ABSTRACT

The present disclosure relates to a shift bracket that is coupled to a top plate of a cover panel for covering a floor tunnel and to which a shift lever unit is attached on an upper side. The shift bracket includes: a base plate to which the shift lever unit is attached; and a front leg portion and a rear leg portion that are coupled to the base plate and the top plate of the cover panel and hold the base plate with a space being provided upward in a vehicle vertical direction from the top plate. An ECU is disposed in the space between the top plate of the cover panel and the base plate.

8 Claims, 2 Drawing Sheets

(56) References Cited

U.S. PATENT DOCUMENTS

| | | | | |
|---|---|---|---|---|
| 7,421,923 | B2* | 9/2008 | Kim | F16H 59/0204 |
| | | | | 74/473.12 |
| 7,510,404 | B2* | 3/2009 | Koyama | B60R 16/0215 |
| | | | | 180/400 |
| 7,513,550 | B1* | 4/2009 | Abro | B60R 7/04 |
| | | | | 296/24.34 |
| 7,874,603 | B2* | 1/2011 | Stoner | B60K 20/04 |
| | | | | 296/24.34 |
| 7,997,548 | B2* | 8/2011 | Sugiyama | B60K 20/02 |
| | | | | 248/220.21 |
| 8,414,047 | B2* | 4/2013 | Vasko | B60R 7/04 |
| | | | | 296/24.3 |
| 8,931,818 | B2* | 1/2015 | Inoue | B60N 3/026 |
| | | | | 296/1.02 |
| 9,145,174 | B2* | 9/2015 | Iwano | B62D 25/163 |
| 9,365,165 | B2* | 6/2016 | Koyama | B60R 11/00 |
| 9,505,387 | B2* | 11/2016 | Tanigaki | B60K 20/04 |
| 9,738,155 | B2* | 8/2017 | Chen | B60N 2/75 |
| 9,776,586 | B2* | 10/2017 | Meyers | B62D 25/20 |
| 10,870,346 | B2* | 12/2020 | Fujita | B60K 20/08 |
| 2004/0065496 | A1* | 4/2004 | Kim | B60R 21/045 |
| | | | | 180/271 |
| 2004/0216549 | A1* | 11/2004 | Shiomi | F16H 59/105 |
| | | | | 74/473.12 |
| 2005/0116488 | A1 | 6/2005 | Sakakibara | |
| 2006/0197361 | A1 | 9/2006 | Ito et al. | |
| 2007/0138819 | A1* | 6/2007 | Akimoto | B60N 2/793 |
| | | | | 296/37.8 |
| 2007/0181763 | A1* | 8/2007 | Babian | B60R 11/00 |
| | | | | 248/300 |
| 2008/0041180 | A1* | 2/2008 | Cho | F16H 59/105 |
| | | | | 74/473.1 |
| 2012/0137810 | A1 | 6/2012 | Kim et al. | |
| 2016/0131247 | A1* | 5/2016 | Kim | B60K 35/00 |
| | | | | 74/473.3 |

FOREIGN PATENT DOCUMENTS

| | | |
|---|---|---|
| JP | 2006-240415 A | 9/2006 |
| JP | 2012-116458 A | 6/2012 |
| JP | 2016-101789 A | 6/2016 |

* cited by examiner

SHIFT BRACKET

CROSS REFERENCE TO RELATED APPLICATION

This application claims priority to Japanese Patent Application No. 2018-154733 filed on Aug. 21, 2018, which is incorporated herein by reference in its entirety including the specification, claims, drawings, and abstract.

TECHNICAL FIELD

The present disclosure relates to a structure of a shift bracket that is attached to a shift lever of a vehicle.

BACKGROUND

A vehicle is provided with a floor tunnel that accommodates a coupling member coupling a front compartment for accommodating an engine, a power unit, and the like in a front portion of the vehicle with a device disposed under a floor or in a rear portion of the vehicle. For example, in a case of the vehicle on which the engine is mounted, an exhaust pipe from the engine, and the like are disposed in the floor tunnel. In a case of an electrically-driven vehicle, a power cable or the like that couples an electric motor or a control unit disposed in the front compartment with a battery disposed under the floor or in the rear portion of the vehicle is accommodated in the floor tunnel.

There has been proposed a structure of covering the floor tunnel with a cover panel that is projected in a vehicle upward direction from a floor panel and has a substantially groove-shaped cross-section, attaching a shift lever support base to an upper surface of this cover panel, and attaching a shift lever onto the shift lever support base (for example, see JP 2006-240415 A).

SUMMARY

In recent years, a large number of electric vehicles, each of which travels only using a motor, have been used. The number of members provided through the floor tunnel is smaller in the electric vehicle than in the vehicle on which the engine is mounted. Thus, a height of the floor tunnel in the electric vehicle is low. For such a reason, in a case of a configuration as disclosed in the related art such as JP 2006-240415 A, there is a problem that a projection height of the cover panel is low, and a height of the shift lever is thus lowered, which degrades usability of the shift lever.

Meanwhile, in recent years, it is desired that the electric vehicle has advanced functions. Thus, the number of electronic control units (ECU), which control the device such as a sensor mounted on the vehicle, is increased. As a result, there is a problem of a shortage in a mounting space for the ECUs.

In view of the above, the present disclosure has a purpose of improving usability of a shift lever and securing the space for mounting electronic control units.

A shift bracket according to the present disclosure is a shift bracket disposed at a center in a vehicle width direction, coupled to a top plate of a cover panel for covering a floor tunnel that is projected upward in a vehicle vertical direction from a floor panel and extends in a vehicle longitudinal direction, and to which a shift lever is attached on an upper side in the vehicle vertical direction, and includes:

a base plate to which the shift lever is attached; and a plurality of leg portions that are coupled to the base plate and the top plate of the cover panel and hold the base plate with a space being provided upward in the vehicle vertical direction from the top plate. In the shift bracket, an electronic control unit is disposed in the space between the top plate of the cover panel and the base plate.

Just as described, the base plate of the shift bracket is held with the space being provided upward in the vehicle vertical direction from the top plate of the cover panel, and the shift lever is attached onto the base plate. Thus, a height of the shift lever can be set to a height that allows an occupant to easily use the shift lever. In addition, since the electronic control unit can be disposed in the space between the top plate and the base plate, the space for mounting the electronic control unit can be secured.

In the shift bracket according to the present disclosure, the electronic control unit may be attached to the base plate or one of the leg portions.

With such a configuration, the shift bracket, to which the electronic control unit is attached, can be integrally mounted on the cover panel. Thus, manufacturing man-hours can be reduced.

In the shift bracket according to the present disclosure, the base plate may be a groove-shaped cross-section member having a groove-shaped cross-section with a lower side opened in the vehicle vertical direction and having flanges that are located on both sides in the vehicle width direction and extend in the vehicle longitudinal direction, at least one of the leg portions may be a groove-shaped cross-section member having a groove-shaped cross-section opened in the vehicle longitudinal direction and having flanges that are located on both sides in the vehicle width direction and extend in the vehicle vertical direction, and the flanges of the base plate may be coupled to the flanges of the leg portions.

As just described, since the flanges on both of the sides in the vehicle width direction of at least one of the leg portion are coupled to the flanges on both of the sides in the vehicle width direction of the base plate, rigidity of the shift bracket in the vehicle width direction can be increased. As a result, operability of the shift lever during a lateral shift operation can be improved.

In the shift bracket according to the present disclosure, a portion between the flanges of at least one of the leg portions may include a plate-shaped member, and at least one of the leg portions may have a length in the vehicle width direction that is equal to or greater than the length of the electronic control unit in the vehicle width direction.

With such a configuration, the plate-shaped member between the flanges of the leg portions shields against the electromagnetic waves from the electronic control unit disposed beneath the base plate. Thus, it is possible to reduce the influence of the electromagnetic waves on other electronic devices.

The present disclosure can improve usability of the shift lever and secure the space for mounting electronic control units.

BRIEF DESCRIPTION OF DRAWINGS

Embodiment(s) of the present disclosure will be described by reference to the following figures, wherein.

DESCRIPTION OF EMBODIMENTS

Configuration of Shift Bracket

With reference to the drawings, a description will hereinafter be made on a shift bracket 20 according to an embodiment. An arrow FR, an arrow UP, and an arrow RH illustrated in each of the drawings, which will be described below, respectively indicate a front direction (an advancing direction), an up direction, and a right direction of a vehicle. In addition, opposite directions of the arrows FR, UP, RH respectively indicate a rear direction, a down direction, and a left direction of the vehicle. In the case where a description will hereinafter be made by simply using the front-rear, right-left, and up-down directions, unless otherwise noted the front-rear, right-left, and up-down directions respectively indicate front and rear in a vehicle longitudinal direction, right and left in a vehicle lateral direction (a vehicle width direction), and up and down in a vehicle vertical direction.

Figure 1:
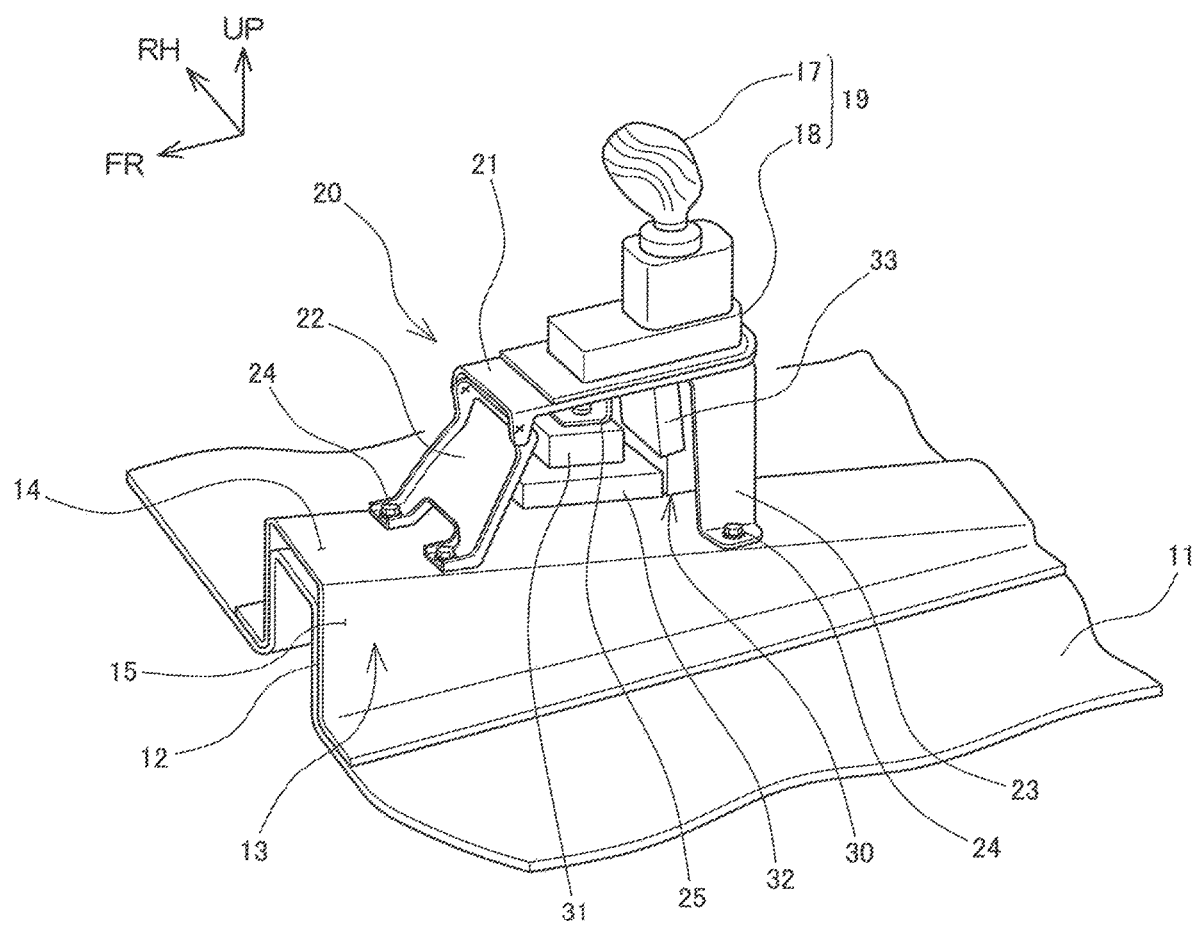
FIG. 1 is a perspective view of a state where a shift bracket according to an embodiment is coupled to a top plate of a cover panel for covering a floor tunnel.

As illustrated in FIG. 1, the vehicle is provided with a floor tunnel 12 that is disposed at a center in the vehicle width direction, is projected upward in the vehicle vertical direction from a floor panel 11, and extends in the vehicle longitudinal direction. The floor tunnel 12 accommodates a power cable that couples an electric motor or a control unit disposed in a front compartment in a front portion of the vehicle and a battery disposed under a floor or in a rear portion of the vehicle, and the like.

A cover panel 13 that covers the floor tunnel 12 from above is attached to an upper side of the floor tunnel 12. The cover panel 13 is a groove-shaped cross-section member that includes a top plate 14 and lateral plates 15 that are provided to be projected in the vehicle down direction from both sides in a width direction of the top plate 14, and is a vehicle frame member that extends in the vehicle longitudinal direction.

The shift bracket 20 is coupled to an upper side of the top plate 14 in the cover panel 13. A shift lever unit 19 is attached to an upper surface of the shift bracket 20. The shift lever unit 19 includes: a shift lever 17 to be operated by an occupant; and a body 18 that detects a position of the shift lever 17 and transmits the position to a controller.

The shift bracket 20 includes: a base plate 21 to which the shift lever unit 19 is attached; and a front leg portion 22 and a rear leg portion 23 as a plurality of leg portions that are coupled to the base plate 21 and the top plate 14 of the cover panel 13 and hold the base plate 21 with a space 30 being provided upward in the vehicle vertical direction from the top plate 14. The front leg portion 22 and the rear leg portion 23 are fixed onto the top plate 14 by bolts 24. A height of the base plate 21 can freely be adjusted by changing heights of the front leg portion 22 and the rear leg portion 23.

Figure 2:
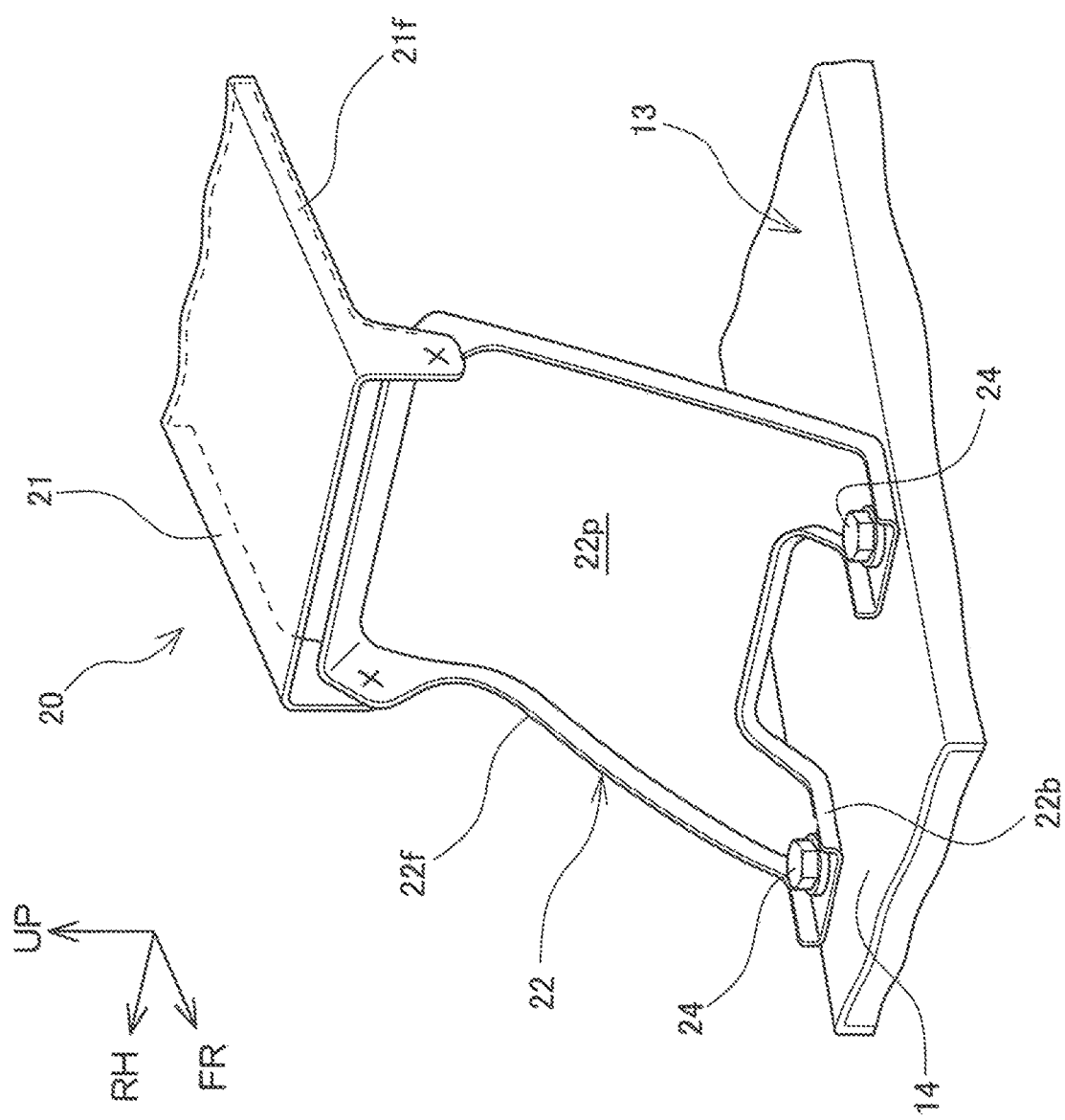
FIG. 2 is a perspective view of a state where a flange of a base plate in the shift bracket illustrated in FIG. 1 is coupled to a flange of a leg portion.

As illustrated in FIG. 2, the base plate 21 is a groove-shaped cross-section member having a groove-shaped cross-section with a lower side opened in the vehicle vertical direction and having flanges 21f that are located on both sides in the vehicle width direction and extend in the vehicle longitudinal direction. The front leg portion 22 is also a groove-shaped cross-section member having a groove-shaped cross-section opened to the vehicle front side and having flanges 22f that are located on both sides in the vehicle width direction and extend in the vehicle vertical direction. A plate-shaped member 22p in a flat plate shape is provided between the flanges 22f on both of the sides of the front leg portion 22. The plate-shaped member 22p is disposed such that a surface thereof faces the vehicle longitudinal direction. A front end of each of the flanges 21f in the base plate 21 extends downward. Onto an inner surface in the vehicle width direction of this portion, an outer surface in the vehicle width direction of each of the flanges 22f at an upper end of the front leg portion 22 is superimposed and is coupled by spot welding, as indicated by a cross mark in FIG. 2.

Each attachment portion 22b provided at a lower end of the front leg portion 22 has a U-shaped cross-section in which the flanges are raised on both sides of a bolt hole. The attachment portions 22b are fixed to the top plate 14 of the cover panel 13 by the bolts 24.

As illustrated in FIG. 1, the rear leg portion 23 is a plate member that is folded to be projected upward in a U shape. An upper portion of the rear leg portion 23 is fixed to a lower surface of the base plate 21 by spot welding, and an attachment flange provided at each lower end is fixed to the top plate 14 of the cover panel 13 by the bolt 24.

Electronic control units 31, 32, and 33 (hereinafter referred to as ECUs 31, 32, and 33) are disposed in the space 30 between the top plate 14 of the cover panel 13 and the base plate 21 of the shift bracket 20.

The ECU 31 is fixed to a bracket 25, which is attached to the lower surface of the base plate 21, by a bolt. The ECU 32 is fixed to a vehicle rear side of the front leg portion 22 by an unillustrated bracket. The ECU 33 is fixed to the lower surface of the base plate 21.

The front leg portion 22 is made from a material such as metal that can shield against electromagnetic waves, for example. In addition, in the front leg portion 22, a length of the plate-shaped member 22p in the vehicle width direction is equal to or greater than a length of each of the ECUs 31 to 33, which are illustrated in FIG. 1 and attached to the shift bracket 20, in the vehicle width direction.

Operations and Effects of Shift Bracket

In the shift bracket 20 according to the embodiment, which has been described so far, the base plate 21 is held with the space 30 being provided between the base plate 21 and the top plate 14 of the cover panel 13, and the shift lever unit 19 is attached onto the base plate 21. Thus, a height of the shift lever 17 can be set to a height that allows the occupant to easily use the shift lever 17. In addition, since the ECUs 31 to 33 can be disposed in the space 30 between the top plate 14 of the cover panel 13 and the base plate 21, a large number of the ECUs can be mounted. Furthermore, each of the ECUs 31 to 33 can be fixed to the cover panel 13 as the frame member via the shift bracket 20.

Since the ECUs 31 to 33 are attached to the base plate 21, the front leg portion 22, or the rear leg portion 23, the shift bracket 20, to which the ECUs 31 to 33 are attached, can integrally be mounted on the top plate 14 of the cover panel 13. Thus, manufacturing man-hours can be reduced.

Since the flanges 22f on both of the sides in the vehicle width direction of the front leg portion 22 are coupled to the flanges 21f on both of the sides in the vehicle width direction of the base plate 21, rigidity of the shift bracket 20 in the vehicle width direction can be increased. As a result, operability of the shift lever 17 during a lateral shift operation can be improved.

In the shift bracket 20 according to the embodiment, a portion between the flanges 22f of the front leg portion 22 includes the plate-shaped member 22p, which includes a member made of a metal or other materials capable of shielding against electromagnetic waves, and the front leg portion 22 has a length in the vehicle width direction which is equal to or greater than the length of each of the ECUs 31 to 33 in the vehicle width direction. Accordingly, the plate-shaped member 22p of the front leg portion 22 functions as a shielding plate that shields against the electromagnetic waves, and thus can suppress an influence of the electromagnetic waves generated by each of the ECUs 31 to 33 on another electronic device disposed in the front portion of the vehicle.

In the description that has been made so far, the rear leg portion 23 is the U-shaped folded plate member. However, the rear leg portion 23 is not limited thereto. Similar to the front leg portion 22, the rear leg portion 23 may include a groove-shaped cross-section member having a groove-shaped cross-section opened to the vehicle front side and having flanges that are located on both sides in the vehicle width direction and extend in the vehicle vertical direction. In such a case, it is possible to reduce the influence of the electromagnetic waves generated by each of the ECUs 31 to 33, which are mounted in front of the rear leg portion 23, on other electronic devices disposed in the rear portion of the vehicle. In addition, each of the front leg portion 22 and the rear leg portion 23 may have a groove-shaped cross-section opened to the vehicle rear side. Furthermore, both sides of the shift bracket 20 in the vehicle width direction may be covered with an electromagnetic shielding member, so as to further reduce the influence of the electromagnetic waves.

The invention claimed is:

1. A shift bracket disposed at a center in a vehicle width direction, attached to a top plate of a cover panel for covering a floor tunnel that is projected upward in a vehicle vertical direction from a floor panel and extends in a vehicle longitudinal direction, and to which a shift lever is attached on an upper side in the vehicle vertical direction, the shift bracket comprising:
   a base plate to which the shift lever is attached; and
   a plurality of leg portions that are coupled to the base plate and the top plate of the cover panel and hold the base plate with a space being provided upward in the vehicle vertical direction from the top plate, at least one of the leg portions including a plate-shaped member, wherein
   at least one of the leg portions is spot welded to the base plate,
   an electronic control unit is disposed in the space between the top plate of the cover panel and the base plate, and
   the plate-shaped member at least partially overlaps the electronic control unit in the vehicle longitudinal direction.

2. The shift bracket according to claim 1, wherein the electronic control unit is attached to the base plate or one of the leg portions.

3. The shift bracket according to claim 1, wherein the base plate is a groove-shaped cross-section member having a groove-shaped cross-section with a lower side opened in the vehicle vertical direction and having flanges that are located on both sides in the vehicle width direction and extend in the vehicle longitudinal direction,
   at least one of the leg portions is a groove-shaped cross-section member having a groove-shaped cross-section opened in the vehicle longitudinal direction and having flanges that are located on both sides in the vehicle width direction and extend in the vehicle vertical direction, and
   the flanges of the base plate are coupled to the flanges of the leg portions.

4. The shift bracket according to claim 2, wherein the base plate is a groove-shaped cross-section member having a groove-shaped cross-section with a lower side opened in the vehicle vertical direction and having flanges that are located on both sides in the vehicle width direction and extend in the vehicle longitudinal direction,
   at least one of the leg portions is a groove-shaped cross-section member having a groove-shaped cross-section opened in the vehicle longitudinal direction and having flanges that are located on both sides in the vehicle width direction and extend in the vehicle vertical direction, and
   the flanges of the base plate are coupled to the flanges of the leg portions.

5. The shift bracket according to claim 3, wherein a portion between the flanges of at least one of the leg portions includes the plate-shaped member, and
   at least one of the leg portions has a width in the vehicle width direction that is equal to or greater than that of the electronic control unit in the vehicle width direction.

6. The shift bracket according to claim 4, wherein a portion between the flanges of at least one of the leg portions includes the plate-shaped member, and
   at least one of the leg portions has a width in the vehicle width direction that is equal to or greater than that of the electronic control unit in the vehicle width direction.

7. The shift bracket according to claim 3, wherein the flanges of the base plate are coupled to the flanges of the leg portions by spot welding.

8. The shift bracket according to claim 4, wherein the flanges of the base plate are coupled to the flanges of the leg portions by spot welding.

\* \* \* \* \*